(12) United States Patent
Eder et al.

(10) Patent No.: US 9,318,683 B2
(45) Date of Patent: Apr. 19, 2016

(54) THERMOELECTRIC MODULE FOR A THERMOELECTRIC GENERATOR OF A VEHICLE AND VEHICLE HAVING THERMOELECTRIC MODULES

(71) Applicants: EMITEC GESELLSCHAFT FUER EMISSIONSTECHNOLOGIE MBH, Lohmar (DE); BAYERISCHE MOTOREN WERKE AKTIENGESELLSCHAFT, Munich (DE)

(72) Inventors: Andreas Eder, Munich (DE); Stefan Neugebauer, Ohlstadt (DE); Matthias Linde, Munich (DE); Sigrid Limbeck, Much (DE); Rolf Brueck, Bergisch Gladbach (DE)

(73) Assignees: EMITEC Gesellschaft fuer Emissionstechnologie mbH, Lohmar (DE); Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 13/886,425

(22) Filed: May 3, 2013

(65) Prior Publication Data
US 2013/0276853 A1    Oct. 24, 2013

Related U.S. Application Data

(63) Continuation of application No. PCT/EP2011/067952, filed on Oct. 14, 2011.

(30) Foreign Application Priority Data

Nov. 3, 2010 (DE) .......... 10 2010 050 395

(51) Int. Cl.
*H01L 35/28* (2006.01)
*H01L 35/32* (2006.01)
*F02G 5/00* (2006.01)

(52) U.S. Cl.
CPC ........ *H01L 35/32* (2013.01); *F02G 5/00* (2013.01); *Y02T 10/166* (2013.01)

(58) Field of Classification Search
None
See application file for complete search history.

(56) References Cited

U.S. PATENT DOCUMENTS 3,610,809 A * 10/1971 Eigenbrod .............. 174/15.5
5,168,339 A    12/1992 Yokotami et al.
(Continued)

FOREIGN PATENT DOCUMENTS

DE    10 2006 039 024 A1    2/2008
DE       102009009586 A1    8/2010
(Continued)

OTHER PUBLICATIONS

International Search Report of PCT/EP2011/067952, dated Apr. 4, 2013.

*Primary Examiner* — Eli Mekhlin
(74) *Attorney, Agent, or Firm* — Lawrence A. Greenberg; Werner H. Stemer; Ralph E. Locher

(57) ABSTRACT

A thermoelectric module includes an inner circumferential surface, an axis and an outer circumferential surface. A plurality of semiconductor elements is disposed with thermoelectric material in the direction of the axis and between the inner circumferential surface and the outer circumferential surface and are electrically interconnected in an alternating manner. At least one part of the semiconductor elements has at least one inner frame part or an outer frame part. At least some of the inner frame parts form an interrupted inner circumferential surface or outer frame parts form an interrupted outer circumferential surface.

10 Claims, 4 Drawing Sheets

(56) References Cited

U.S. PATENT DOCUMENTS

| | | | |
|---|---|---|---|
| 5,228,923 A | 7/1993 | Hed | |
| RE35,441 E * | 2/1997 | Yokotani et al. | 257/64 |
| 6,252,154 B1 | 6/2001 | Kamada et al. | |
| 2003/0140957 A1* | 7/2003 | Akiba | 136/224 |
| 2005/0217714 A1 | 10/2005 | Nishijima et al. | |
| 2007/0199587 A1* | 8/2007 | Takahashi | 136/208 |
| 2007/0220902 A1* | 9/2007 | Matsuoka et al. | 62/3.3 |
| 2008/0237846 A1* | 10/2008 | Terui et al. | 257/717 |
| 2010/0072943 A1* | 3/2010 | Mahawili | 136/205 |
| 2010/0140568 A1* | 6/2010 | Tohma et al. | 252/519.12 |
| 2011/0314798 A1 | 12/2011 | Limbeck et al. | |

FOREIGN PATENT DOCUMENTS

| | | |
|---|---|---|
| JP | H05283753 A | 10/1993 |
| JP | 2004088057 A | 3/2004 |
| JP | 2004241404 A | 8/2004 |
| RU | 2178221 C2 | 1/2002 |
| RU | 51287 U1 | 1/2006 |
| WO | 2006004060 A1 | 1/2006 |
| WO | 2010094533 A2 | 8/2010 |

\* cited by examiner

THERMOELECTRIC MODULE FOR A THERMOELECTRIC GENERATOR OF A VEHICLE AND VEHICLE HAVING THERMOELECTRIC MODULES

CROSS-REFERENCE TO RELATED APPLICATION

This application is a continuation, under 35 U.S.C. §120, of copending International Application No. PCT/EP2011/067952, filed Oct. 14, 2011, which designated the United States; this application also claims the priority, under 35 U.S.C. §119, of German Patent Application DE 10 2010 050 395.9, filed Nov. 3, 2010; the prior applications are herewith incorporated by reference in their entirety.

BACKGROUND OF THE INVENTION

Field of the Invention

The present invention relates to a thermoelectric module, particularly for use in a thermoelectric generator used in a vehicle. The invention also relates to a vehicle having thermoelectric modules.

The exhaust gas from an internal combustion engine of a motor vehicle possesses thermal energy, which can be converted into electrical energy by using a thermoelectric generator, for example in order to charge a battery or other energy storage device and/or to deliver the necessary energy directly to electrical consumers. The motor vehicle is thereby operated with improved energy efficiency, and more energy is available for the operation of the motor vehicle.

Such a thermoelectric generator includes at least one thermoelectric module. Thermoelectric modules include at least two semiconductor elements (p-type and n-type), for example, which are alternately provided with electrically conductive bridges on their upper side and underside (respectively facing the hot side and the cold side), and which form the smallest thermoelectric unit or a thermoelectric element. Thermoelectric materials are of such a type that they are capable of converting thermal energy into electrical energy (Seebeck effect) and vice-versa (Peltier effect). If a temperature gradient is supplied on the two sides of the semiconductor elements, a voltage potential is formed between the ends of the semiconductor elements. The charge carriers on the hotter side are increasingly excited into the conduction band by the higher temperature. Due to the concentration difference in the conduction band generated by that process, charge carriers diffuse to the colder side of the semiconductor element, thereby generating the potential difference. In a thermoelectric module numerous semiconductor elements are preferably electrically connected in series. In order to ensure that the generated potential differences of the serial semiconductor elements do not cancel one another out, semiconductor elements are always brought alternately into direct electrical contact with different majority charge carriers (n-type and p-type). The circuit can be closed by a connected load resistance, therefore allowing electrical power to be tapped off.

In order to ensure that the semiconductor elements are always serviceable, a diffusion barrier, which prevents a diffusion of material contained in the electrical bridges or in the brazing material into the thermoelectric material and thereby a loss of efficiency or a functional failure of the semiconductor material or the thermoelectric element, is normally disposed between the electrically conductive bridges and the thermoelectric material. The thermoelectric modules and the semiconductor elements are usually constructed by assembling the individual components—the thermoelectric material, diffusion barrier, electrically conductive bridges, insulation and any other housing elements—to form a thermoelectric module, over which a hot or cold medium flows. That assembly of numerous individual components also requires precise coordination of the individual component tolerances and allowance for the heat transfers from the hot side to the cold side, and adequate contacting of the electrically conductive bridges, so that a flow of current can be generated through the thermoelectric module.

In order to provide for the configuration of such semiconductor elements in a thermoelectric module, housings, walls and/or support tubes, to which the semiconductor elements are attached, are normally provided for externally defining the module. That leads, in particular, to the setting of high tolerance requirements, in order firstly to achieve an accurately fitting configuration of the semiconductor elements with respect to the electrical connections and the position of the housing. An additional problem is that due to the differing thermal loads on the external and internal housing parts, different expansion properties of those components also have to be compensated for without introducing particularly high stresses into the thermoelectric material. There is a desire, precisely with a view to such production of thermoelectric modules, to be able to combine the plurality of components easily with one another, to facilitate the storage and handling and also to produce a light, stable structure when assembling them.

SUMMARY OF THE INVENTION

It is accordingly an object of the invention to provide a thermoelectric module for a thermoelectric generator of a vehicle and a vehicle having thermoelectric modules, which overcome the hereinafore-mentioned disadvantages and at least partially solve the highlighted problems of the heretofore-known modules and vehicles of this general type. In particular, it is intended to specify a thermoelectric module which is technically easy to manufacture, which has a smaller number of parts, which is stable for the desired purpose and/or which moreover has a high level of efficiency, in order to generate electrical energy from the thermal energy of an exhaust gas.

With the foregoing and other objects in view there is provided, in accordance with the invention, a thermoelectric module, comprising an inner circumferential surface, an axis and an outer circumferential surface, a plurality of semiconductor elements with thermoelectric material disposed in the direction of the axis, between the inner circumferential surface and the outer circumferential surface and electrically interconnected in turn or in an alternating manner. Moreover, at least one part of the semiconductor elements includes at least one inner frame part or an outer frame part. Furthermore, at least inner frame parts form an interrupted inner circumferential surface or outer frame parts form an interrupted outer circumferential surface.

The thermoelectric module, in particular, constitutes a separate component of a thermoelectric generator. In this case the thermoelectric module preferably includes a connection, which may serve to connect such a thermoelectric module electrically to a plurality of other thermoelectric modules. The electrical connection of all integral semiconductor elements, in particular, is therefore accomplished inside the thermoelectric module. Such a thermoelectric module is now exposed to a cooling medium on one side and a hot medium on the other. The prime consideration in this case is that the thermoelectric module is brought into contact through its outer circumferential surface with a cooling medium and through its inner circumferential surface with a hot medium (in particular exhaust gas), and has these media flowing through/around it. The inner circumferential surface thereby virtually forms a so-called hot side and the outer circumferential surface forms a so-called cold side of the thermoelectric module.

The thermoelectric module furthermore preferably has an elongated construction, that is to say, for example in the manner of a rail or a tube. Even though the thermoelectric module is most preferably constructed roughly in the form of a cylinder or a tube, such a shape is not absolutely necessary. In particular, oval cross sections or polygonal cross sections may also be entertained for such a thermoelectric module. According to this construction, a central axis, an inner circumferential surface and an outer circumferential surface can also then be identified. The inner circumferential surface in this case, in particular, defines an internal duct, through which the hot medium (exhaust gas) can flow.

The thermoelectric materials are positioned between this inner circumferential surface and the outer circumferential surface, with these materials each being assigned to so-called semiconductor elements. A plurality of such semiconductor elements may be disposed so as to be stacked one on top of another in the direction of the axis, particularly in such a way that a semiconductor element with p-type thermoelectric material and a semiconductor element with n-type thermoelectric material are alternately disposed adjacent one another. In this respect, the semiconductor element of a predefined doping type most preferably extends around the entire inner circumferential surface, for example in the manner of disks or rings. This thermoelectric material is now enclosed by an inner frame part and/or an outer frame part. The semiconductor element in each case preferably includes an inner frame part and an outer frame part, which in each case completely enclose the thermoelectric material internally and externally. The frame parts are constructed in the manner of rings or cylinders, for example, according to the shape of the semiconductor element.

The thermoelectric material is more preferably force-lockingly connected (pressed) to the frame parts. "Force-locking connections" are produced by the transmission of forces. These include compressive forces and/or frictional forces, for example. The coherence of the force-locking connection is ensured purely by the acting force.

It is further preferred that the frame parts simultaneously form a diffusion barrier for the thermoelectric material and an electrical conductor. Nickel or molybdenum are preferred as a material for the frame parts, with these materials in either case most preferably accounting for at least 95 percent by mass of the material of the frame parts. The following materials, in particular, are regarded as suitable thermoelectric material:

n-type: $Bi_2Te_3$; PbTe; $Ba_{0.3}Co_{3.95}Ni_{0.05}Sb_{12}$; $Ba_y(Co,Ni)_4Sb_{12}$; $CoSb_3$; $Ba_8Ga_{16}Ge_{30}$; $La_2Te_3$; SiGe; $Mg_2(Si,Sn)$;
p-type: $(Bi,Sb)_2TE_3$; $Zn_4Sb_3$; TAGS; PbTe; SnTe; $CeFe_4Sb_{12}$; $Yb_{14}MnSb_{11}$; SiGe; $Mg_2(Si,Sb)$.

The thermoelectric materials and the semiconductor elements are now electrically interconnected in turn or in alternation, so that a flow of current is formed through the thermoelectric module and the thermoelectric materials due to the temperature difference between the inner circumferential surface and the outer circumferential surface. The electrical connection can be achieved by way of a metal bridge, a cable, brazing material or the like. As already stated, the electrical connection is preferably achieved (solely) by the frame part.

In the development of the thermoelectric module according to the invention the inner frame parts now do not form a closed inner circumferential surface and/or the outer frame parts do not form a closed outer circumferential surface. This means, in particular, that the inner circumferential surface and/or the outer circumferential surface is not constructed in the manner of a closed housing wall. Instead, openings are provided in this case. If the thermoelectric module were embodied in the form of a tube, for example, there would be a cylindrical inner circumferential surface and/or a cylindrical outer circumferential surface. The inner frame parts now form only a part of the cylindrical inner circumferential surface, however, so that a part of this (imaginary) cylindrical inner circumferential surface is open or interrupted. This applies correspondingly to an (imaginary) cylindrical outer circumferential surface, which is likewise not completely delineated by the outer frame parts. Although this is illustrated herein for a tubular thermoelectric module, this observation may be transferred analogously to other cross-sectional shapes of the thermoelectric module. These openings in the outer circumferential surface, for example, allow external access to the inner frame parts for assembly and/or joining operations even after assembly of the semiconductor elements. A further reason for the openings proposed herein is that the thermoelectric module and the stacked and/or joined configuration of the semiconductor elements in the area of the outer circumferential surface or the inner circumferential surface is not rigid in the direction of the axis, but the openings can instead be used in order to compensate for thermal expansions and/or production tolerances. Moreover, if with each (centrally disposed) semiconductor element a connecting area to the adjacent semiconductor element is formed both in the area of the inner circumferential surface and in the area of the outer circumferential surface (that is to say, for example, at an end face through the outer frame part and at the other end face through the inner frame part), an inherently stable construction of a thermoelectric module can be created without the need for a further housing in order to stabilize or support this configuration. In particular, it is possible to dispense with an additional inner casing tube and/or an outer casing tube. From this it can immediately be seen that this configuration of semiconductor elements and the profiling and connection of the respective frame parts are technically easy to accomplish. It is furthermore possible to create a robust configuration that will stand up to further machining operations and subsequent use in the thermoelectric generator.

In accordance with another feature of the thermoelectric module of the invention, the semiconductor elements include thermoelectric material which is disposed between an inner frame part and an outer frame part, with the inner frame part and the outer frame part each projecting on one side beyond the thermoelectric material where they form an inherently firm connecting area with an adjacent frame part. In this context all semiconductor elements of the thermoelectric module (with the exception of the semiconductor elements at the beginning and the end) most preferably form corresponding connecting areas with adjacent frame parts. In this case outer frame parts are most preferably always connected to outer frame parts and inner frame parts to inner frame parts. In this respect it is advantageous if the inner frame parts and the outer frame parts in a single semiconductor element project in different directions parallel to the axis. In this context it is possible for each frame part in this case to project only with respect to one side of the thermoelectric material. It is preferable, however, that first the inner frame part and then the outer frame part should project furthest on each of the two sides of the thermoelectric material. Such an inherently firm connecting area can be achieved, for example, by a brazed connection, an adhesively bonded connection or a welded connection. The connecting areas are, in particular, constructed so that they can absorb the static, dynamic and thermal forces that occur in the direction of the axis and/or radially thereto in the operation of a thermoelectric generator in the vehicle. For this purpose the connecting area in each case most preferably extends over the entire circumference of the frame parts, for example as a circumferential weld seam between adjacent outer frame parts and between adjacent inner frame parts. These connecting areas now ensure, in particular, that the thermoelectric module is inherently firm and stable, so as to afford a captive configuration of the plurality of semiconductor elements. In this case, in such a thermoelectric module, in particular more than 10, especially more than 30 and preferably more than 50 such semiconductor elements are stacked and alternately formed with connecting areas. Even in such large, elongated thermoelectric modules a stabilizing, additional inner wall and/or additional outer wall can be dispensed with, making it possible, in particular, to reduce the manufacturing cost and the material outlay.

In accordance with a further preferred feature of the thermoelectric module of the invention, at least the inner frame part or the outer frame part includes an insulation layer. This insulation layer may be provided area by area and/or over the entire surface of the inner frame parts and/or the outer frame parts and serves, in particular, for electrical insulation of the current paths. An insulation layer including aluminum oxide ($Al_2O_3$), in particular, or the like is a possibility in this case.

In accordance with an added advantageous feature of the thermoelectric module of the invention, a free space which is formed between adjacent outer frame parts in the interrupted outer circumferential surface corresponds to a spacing of the thermoelectric material of adjacent semiconductor elements. This means, in particular, that the semiconductor elements with the outer frame parts are disposed so that the largest possible free space is created in the area of the opening in the outer circumferential surface and this free space is, in particular, not restricted by projecting areas of the outer frame parts. This, in particular, allows the maximum available free space to be used in this case, for example in order to form the connecting areas from the outside between the inner frame parts in this free space. Thus it is possible, particularly by using a welding device, to produce a weld seam between the internal inner frame parts through this relatively large free space. This is achieved, in particular, in that the outer frame parts terminate flush with a side face of the thermoelectric material. The adjacent outer frame parts are thereby now as widely separated from one another as the spacing of the upper side and underside of the adjacent thermoelectric materials. In the assembled state a free space running all around in a circumferential direction is often formed, which is defined by the radially outer circumferential surface of the adjacent inner frame parts, the opposing upper side and underside of the adjacent thermoelectric materials and the associated opening in the outer circumferential surface. Consequently, in the case of a cylindrical, tubular thermoelectric module the free space substantially has the shape of a ring, which is disposed concentrically with the axis and extends between adjacent thermoelectric materials.

In accordance with an additional feature of the thermoelectric module of the invention, a free space, which is filled with a porous insulation material, is formed between adjacent outer frame parts, at least in the interrupted outer circumferential surface. This means, in particular, that the free space, accessible from radially outside, between adjacent thermoelectric materials is not (exclusively) filled with air but that in this case a porous insulation material is (additionally) provided. The material now serves, in particular, to provide electrical insulation in the transitional area between adjacent semiconductor elements. The insulation material may equally serve to reduce or to prevent a significant temperature equalization between the inner circumferential surface and the outer circumferential surface in the area of the free space. The porous construction of the insulation material means, in particular, that it is very light and nevertheless can have a high proportion of air as a thermal insulator. Such a porous insulation material particularly worth considering is a highly porous solid, in which, for example, at least 95% or even at least 99% of the volume is formed of pores. The insulation material in this case preferably has a highly dendritic structure, that is to say a branching of particle chains with a high number of gaps in the form of open pores so that, in particular, a relatively stable, sponge-like network structure is formed. The use of a so-called aerogel, for example one that is silicate-based, is most preferable in this case.

In accordance with yet another advantageous feature of the thermoelectric module of the invention, an inherently unstable casing is provided at least on the interrupted inner circumferential surface or on the interrupted outer circumferential surface. The provision of such an inherently unstable casing serves, in particular, to prevent unwanted substances from getting into the intermediate area between the thermoelectric materials and the semiconductor elements. Such an inherently unstable casing is particularly suitable on the cold side of the thermoelectric module. Plastic films, such as a so-called shrink-hose, for example, can be used for just this purpose. Thus it is possible, for example, by using the inherently unstable casing, to prevent the water flowing around the outer circumferential surface from coming into contact with the electrical circuit and/or the thermoelectric material in the thermoelectric module. The term "inherently unstable" casing in this case is intended to signify, in particular, that the stability of the thermoelectric module is influenced only to a slight extent or only to a negligible extent by this casing. This stability is to be achieved by the connecting areas of the adjacent frame parts.

In accordance with yet a further advantageous feature of the thermoelectric module of the invention, an adhesive is placed between the inherently unstable casing and the outer circumferential surface and/or the inner circumferential surface. In particular, this adhesive is disposed between the inherently unstable casing and the outer frame part forming the outer circumferential surface. A corresponding adhesive, which has a "low" temperature resistance of at least 150° C., in particular at least 200° C., can therefore be used on the so-called cold side of the thermoelectric module. In this case the maximum temperature resistance is, in particular, 250° C. The adhesive is, in particular, thermally conductive, so that the flow of heat over the thermoelectric module is influenced only to a slight extent.

In accordance with yet an added feature of the thermoelectric module of the invention, it is possible for a gap, which is bridged by a seal, to be formed between adjacent inner frame parts in the interrupted inner circumferential surface. In view of the fact that it is preferable for outer frame parts and inner frame parts of the adjacent semiconductor elements each to be connected to others of the same type, the inner circumferential surface and the outer circumferential surface are each interrupted alternately, viewed in the direction of the axis. The term chosen herein to describe the opening in the area of the outer circumferential surface is a free space, but where an opening exists in the area of the inner circumferential surface the term used is a gap. The gap in this case relates to the area of the interstice which is formed between the opposing end faces of the inner frame parts. In the case of a cylindrical, tubular thermoelectric module, therefore, the gap has an annular shape substantially concentric with the axis. The opening in the inner circumferential surface or the gap then differs in size according to the profiling of the opposing inner frame parts. If the inner frame parts of adjacent semiconductor elements in this case do not project beyond the thermoelectric material, the gap is substantially as wide as the spacing of the thermoelectric materials of adjacent semiconductor elements. If the inner frame part is constructed to project, at least on one side of a semiconductor element, this gap becomes smaller. Particularly where hot exhaust gas is fed through the thermoelectric module inside the inner circumferential surface, exhaust gas is to be prevented from entering through this gap (and into a free space situated behind it) and causing a temperature equalization there between the inner circumferential surface and the outer circumferential surface, for example. To this end, it is consequently proposed that the gap be sealed. For this purpose a corresponding sealing material is positioned between the inner frame part of the one semiconductor element and the inner frame part of the adjacent semiconductor element. The seal in this case is disposed in particular so that, even in the event of (slight) movements of the inner frame parts relative to one another and/or even with an uneven profiling of the gaps, a virtually gas-tight closure of the gap is nevertheless achieved under all operating conditions. For this purpose the seal may be constructed to be form-lockingly connected with the inner frame parts, for example, and/or it may have a moveable construction. (Form-locking connections are produced by the intermeshing of at least two mating parts. The mechanical connection means that the mating parts cannot be detached from one another even in the absence or interruption of transmitted force.) The seal in this case is particularly suited to withstanding temperatures of up to 400° C. or even up to 700° C. Similarly, the sealing material is preferably constructed so that the thermal expansion properties of adjacent semiconductor elements in the area of the gap or the seal can be compensated for.

In accordance with yet an additional feature of the thermoelectric module of the invention, the semiconductor elements form receptacles for a sealing material in the area of the interrupted inner circumferential surface. Such a receptacle may be formed, for example, by a corresponding free space, in some or all of which sealing material is disposed, for example by resting against the outer frame parts, the thermoelectric materials and possibly (partially) the inner frame parts. It is also possible for the sealing material and the frame parts to form a form-locking connection, for example in the manner of a tongue-and-groove connection. The particular function of this sealing material is to impede and even to prevent a spread of exhaust gas between the thermoelectric materials, in order to also maintain a temperature gradient in this case between the inner circumferential surface and the outer circumferential surface during operation. The sealing material may also serve to constitute an electrical insulation. The use of mica (alumino-silicate) or a comparable material as a sealing material is especially preferred.

In accordance with again another advantageous feature of the thermoelectric module of the invention, the thermoelectric material of the semiconductor elements is provided at least partially with a coating. Such a coating serves, in particular, to permanently ensure the composition or constitution of the thermoelectric material. In particular, the coating is provided over the entire surface of the side face and the upper side and/or the underside of the thermoelectric material, so that the thermoelectric material is most preferably completely enclosed by an inner frame part, an outer frame part and this coating.

With the objects of the invention in view, there is concomitantly provided a motor vehicle, comprising an internal combustion engine, an exhaust system, a cooling system, and a thermoelectric generator including a plurality of modules described herein according to the invention, the exhaust system extending through the inner circumferential surface of the thermoelectric module and the cooling system extending externally along the outer circumferential surface of the thermoelectric module. That is to say, in other words, that the coolant of the coolant system is led along past the outer circumferential surface of the thermoelectric modules, so that the outer circumferential surface of the thermoelectric module constitutes the cold side. This also means that the hot exhaust gas flows internally through a duct, which is defined by the inner circumferential surface of the thermoelectric modules, so that the inner circumferential surface then constitutes the hot side. In this case the thermoelectric generator is more preferably constructed in the manner of a tube bundle, wherein on one hand a plurality of these thermoelectric modules are then connected to the exhaust system, so that hot exhaust gas flows through the latter, and on the other hand, the thermoelectric modules are disposed in a common (spaced) housing, for example, so that a coolant flow can flow around both of them together. Corresponding electrical connections and lines are clearly to be provided, in order to afford a reliable current generation and transmission of the current, the coolant and the exhaust gas.

Other features which are considered as characteristic for the invention are set forth in the appended claims, noting that the features individually described in the claims may be combined with one another in any technologically appropriate manner and set forth further developments of the invention.

Although the invention is illustrated and described herein as embodied in a thermoelectric module for a thermoelectric generator of a vehicle and a vehicle having thermoelectric modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
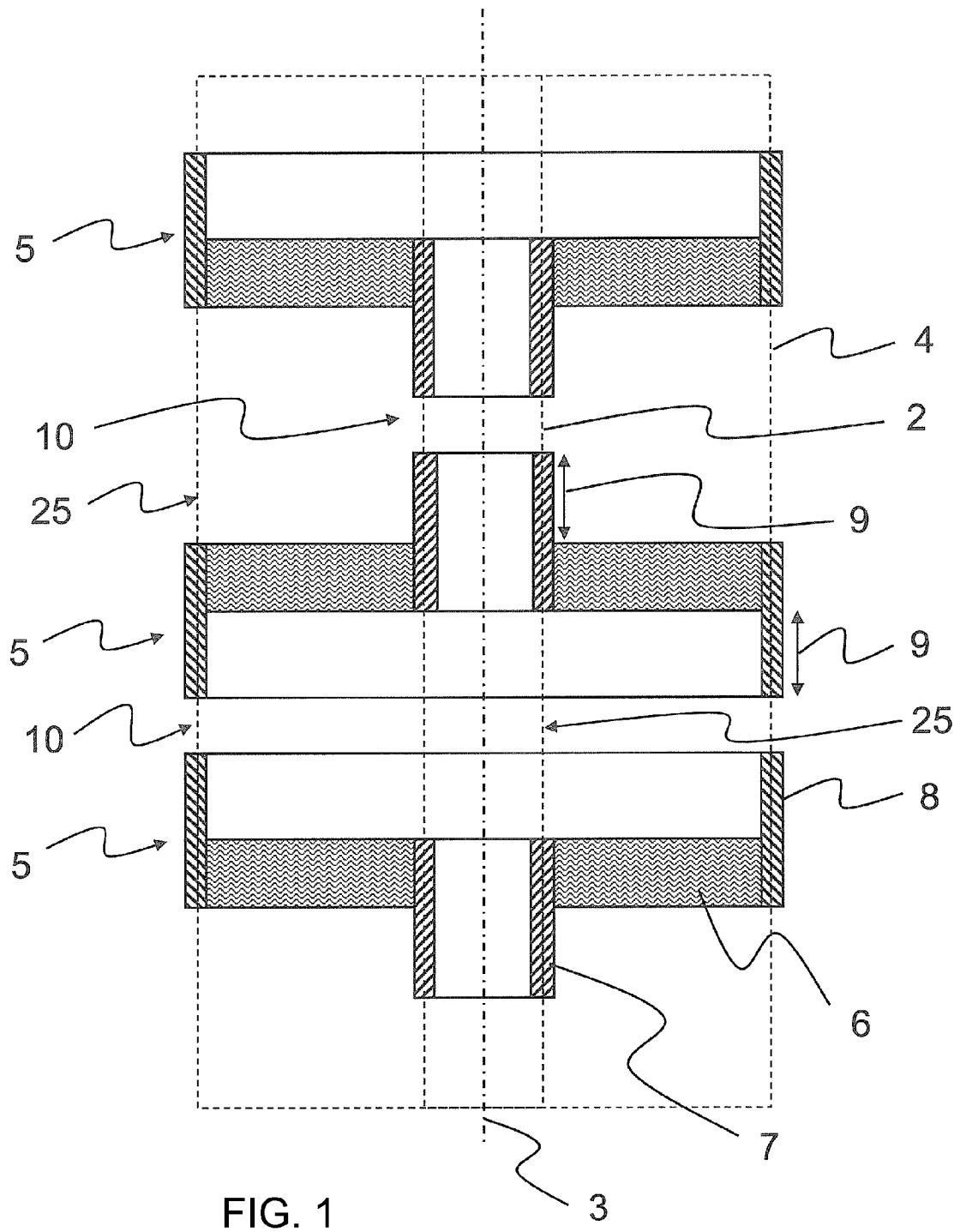
FIG. 1 is a diagrammatic, longitudinal-sectional view of a configuration of multiple semiconductor elements forming a thermoelectric module.

Referring now to the figures of the drawings in detail and first, particularly, to FIG. 1 thereof, there is seen a diagrammatic illustration of how a plurality of semiconductor elements 5 can be assembled to produce a thermoelectric module having characteristics set forth according to the invention. It is firstly to be noted in this case that all of the semiconductor elements 5 have a substantially identical construction, in particular with regard to the configuration and dimensions of an outer frame part 8, a thermoelectric material 6 and an inner frame part 7. A corresponding connection and desired construction of the thermoelectric element is achieved in that the semiconductor elements 5 are disposed with opposing orientations alternating with one another in the direction of an axis 3. This means that in a stacking process the adjacent semiconductor elements 5 come into contact with one another either (solely) through the inner frame parts 7 or the outer frame parts 8. In this case, the thermoelectric material 6 of all of the semiconductor elements 5, which are aligned in a first direction along the axis 3, most preferably have the same doping (for example n-type). The semiconductor elements 5 disposed between each of them and aligned in a second, opposing direction along the axis 3 have another doping (for example p-type).

In the structural variants set forth herein the semiconductor elements 5 are embodied in the manner of ring-shaped disks, with the thermoelectric material 6 being embodied, in particular, in the manner of an annular disk. The radially inner circumferential surface and the outer circumferential surface of the thermoelectric material 6 is in each case respectively covered by the (integral) outer frame part 8 and the (integral) inner frame part 7. The semiconductor elements 5 are furthermore so constructed that the outer frame parts 8 form a projection 9 on one side of the thermoelectric material 6, while the inner frame parts 7 on the opposite side form a projection 9 beyond the thermoelectric material 6. This profiling, together with the alternating opposite orientation of these projections, then allows adjacent semiconductor elements 5 to form connecting areas 10 on one hand through the inner frame parts 7, and on the other hand through adjacent outer frame parts 8. In this case, the projections 9 form a type of ring-shaped collar, which can be assembled (edge to edge) at the end face. This edge area serves, in particular, for forming cohesive material connections, in particular circumferential weld seams (connections in which the connected parts are held together by atomic and/or molecular forces, as is the case, for example, in adhesive bonding, brazing, welding, etc., are termed cohesive material connections).

It can also be readily seen from FIG. 1 that the semiconductor elements 5 assembled in this way do not form a closed inner circumferential surface 2 or a closed outer circumferential surface 4. This can be seen, in particular, from the fact that in a longitudinal section, in which a connecting area 10 of the inner frame parts 7 is formed, no outer frame part 8 is provided on the outside, and vice-versa. This also means, in particular, that a (single) outer frame part 8 does not simultaneously come into contact with two adjacent outer frame parts 8 of the adjacent semiconductor elements 5. Likewise a (single) inner frame part 7 of a semiconductor element 5 is not in contact with two frame parts 7, 8 of adjacent semiconductor elements 5. Therefore, the outer frame parts 8 do not completely fill the outer (imaginary) circumferential surface 4, and the inner frame parts 7 do not fill the entire inner circumferential surface 2. Instead, openings 25 are formed in both cases. The particular assumption in this case is that the inner circumferential surface 2 and the outer circumferential surface 4 can be described by portions of the circumferential surface which are at substantially the same distance from the axis 3. In the case of a cylindrical, tubular thermoelectric module, for example, the outer frame parts 8 and the inner frame parts 7 are likewise cylindrically formed, for example, so that consequently cylindrical inner circumferential surfaces 2 and outer circumferential surfaces 4 are also formed, which extend through the respective outer frame parts 8 and inner frame parts 7. Corresponding observations can be made, for example, if the frame parts form an elliptical or polygonal circumferential surface. Overall, the thermoelectric module then accordingly also has an elliptical or polygonal inner circumferential surface/outer circumferential surface, in which the corresponding circumferential portions of the outer frame parts and inner frame parts are respectively accommodated. A situation in which the outer frame parts 8 and inner frame parts 7 form an interrupted, that is to say incompletely filled inner circumferential surface/outer circumferential surface rather than a closed surface, is then particularly consistent with the invention.

Figure 2:
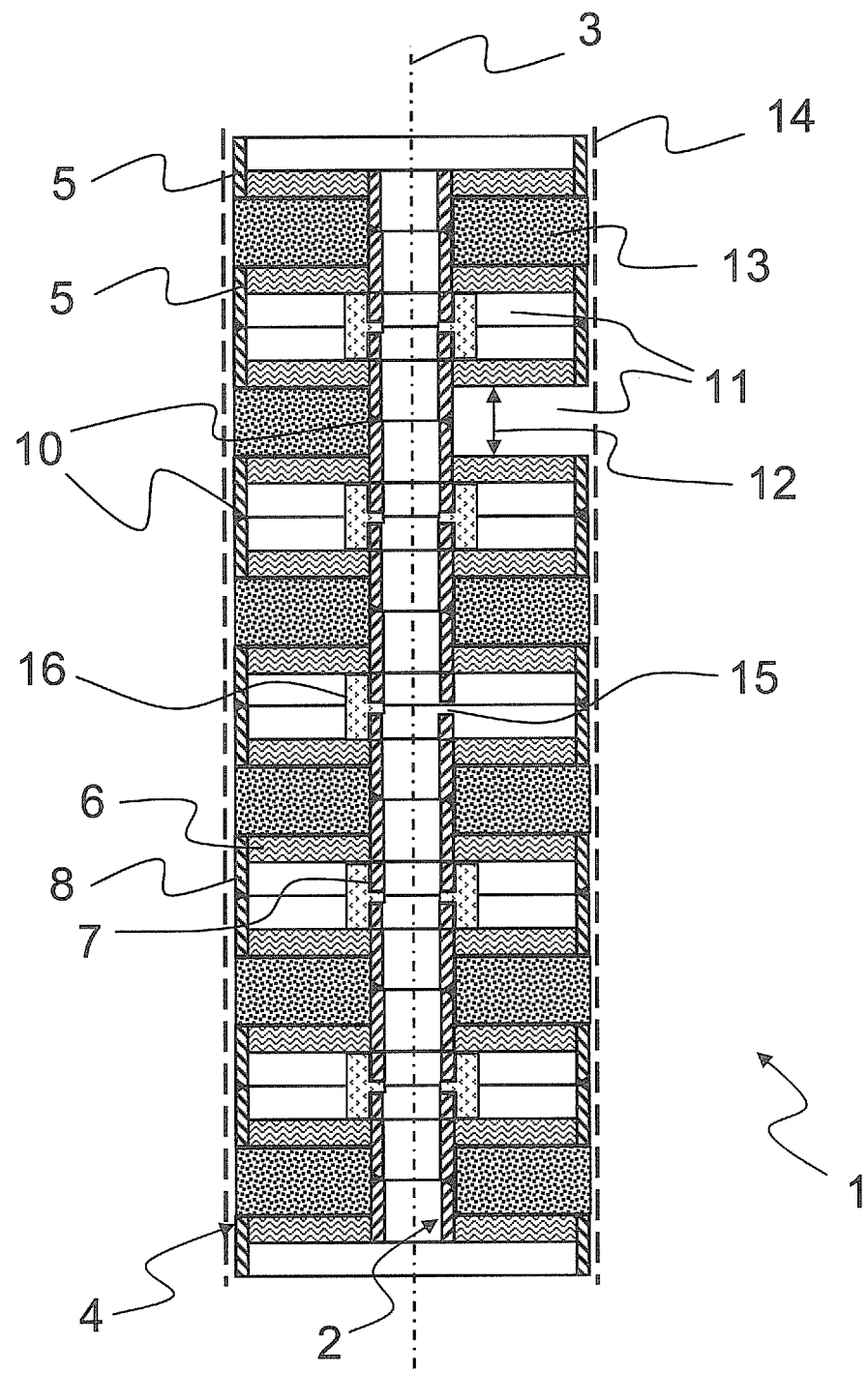
FIG. 2 is a longitudinal-sectional view of a structural variant of a thermoelectric module.

FIG. 2 shows an assembled structural variant of a thermoelectric module 1. In this case the semiconductor elements 5 are now disposed alternately edge to edge along the axis 3 and attached to one another. The semiconductor elements 5 are disposed alternately in such a way that the inner frame parts 7 rest against one another and form a connecting area 10 (for example a weld seam), so that adjacent thereto a free space 11 is formed, which extends radially outwards up to the outer circumferential surface 4. The free space 11 is now configured in such a way that it corresponds to a spacing 12 of the thermoelectric materials 6 of adjacent semiconductor elements 5. For illustration purposes, therefore an element (insulation material 13) which is nevertheless actually provided for operation is omitted from the upper right-hand area of FIG. 2.

It can also be seen therein that an inherently unstable casing 14 is provided on the interrupted outer circumferential surface 4. The casing 14 can be placed or turned over the semiconductor elements 5 from the outside, for example after the configuration or preparation of the internal components of the thermoelectric module 1. A plastic film, for example a so-called shrink hose, is particularly suitable for this purpose. This shrink hose or this inherently unstable casing 14 then ensures that no water can travel into areas inside the outer circumferential surface 4. A good thermal conduction or cooling of the semiconductor elements 5 and the outer frame parts 8 is equally ensured. For this purpose the casing 14 is to have a correspondingly thin construction. In this case, an adhesive is disposed between the inherently unstable casing 14 and the outer frame parts 8, so that in particular a sealing connection is achieved between the outer frame parts 8 and the inherently unstable casing 14. In particular, the adhesive is disposed only at each of the ends of the thermoelectric module 1 between the inherently unstable casing 14 and the outer frame parts 8, so that in this case a sealing connection is achieved in relation to a cooling system, for example.

A porous insulation material 13 is moreover provided in the area of these free spaces 11 which are radially open to the outside. This material is, in particular, a so-called aerogel. The aerogel serves to ensure the large temperature gradient desired on one hand and the electrical neutrality of the free space 11 on the other. The porous insulation material 13 in this case preferably fills the entire outwardly opening free space 11.

The situation on the interrupted inner circumferential surface 2 is also illustrated in the middle area of FIG. 2, while likewise omitting an element (a seal 16). At that location, adjacent semiconductor elements 5, which are connected by projecting outer frame parts 8 oriented towards one another, are also constructed with projecting inner frame parts 7, although those are not in contact with one another but instead form a gap 15 between them. A seal 16, which extends into this gap 15 at this point, is also disposed partially in the free space 11 and extends between the inner frame parts 7, separated by a gap 15, and the outer frame parts 8 connected to one another by a connecting area 10. In this case, the seal 16 is most preferably situated substantially just between the adjacent inner frame parts 7, that is to say it consequently has, in particular, a volume which is no greater than 5 times the gap 15.

Figure 3:
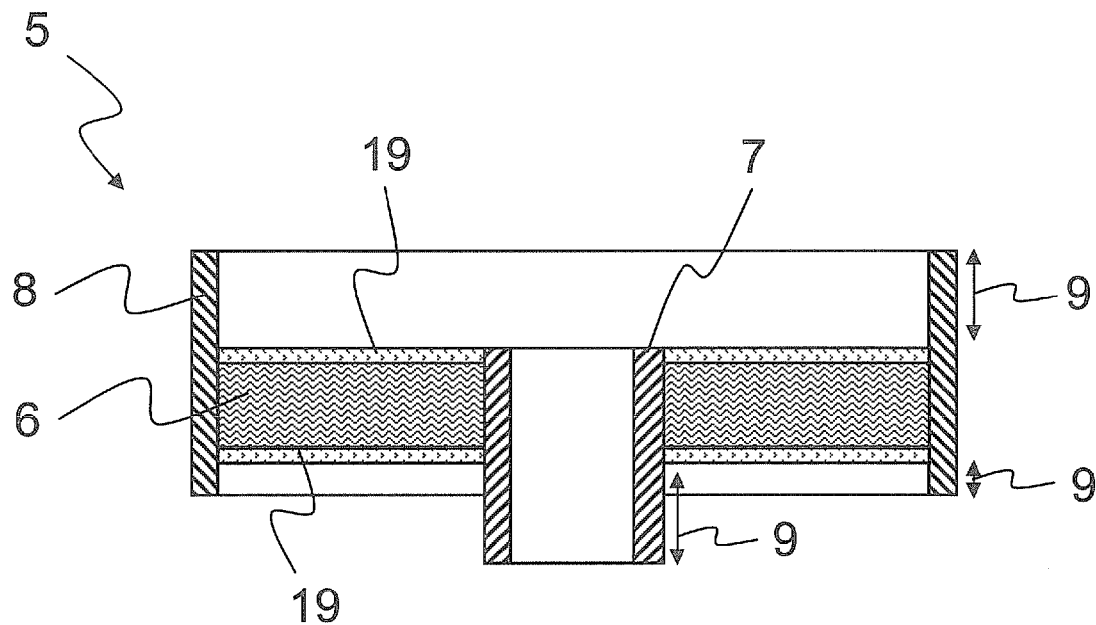
FIG. 3 is a longitudinal-sectional view of another structural variant of a semiconductor element.

FIG. 3 shows a longitudinal section of a structural variant of a semiconductor element 5 for such a thermoelectric module. In this case, the semiconductor element 5 has a cylindrical, rectangular or oval construction. In the structural variant shown therein a substantially ring-shaped thermoelectric material 6 is again provided, which is composed, for example, of pressed powder. In the same way, this thermoelectric material 6 is preferably force-lockingly connected (and/or cohesive materially connected) by pressing to the inner frame part 7 and/or the outer frame part 8. It is now proposed herein that a large projection 9 is formed upwardly with the outer frame part 8 and a small projection 9 is formed downwardly with the outer frame part 8 and a large projection 9 is formed with the inner frame part 7. In this way the contact areas or free spaces towards adjacent semiconductor elements in the configuration can be formed as required into a thermoelectric module. In order to protect the thermoelectric material 6, for example from chemical stress, from thermal stress and/or from damage, the thermoelectric material 6 includes a coating 19 on boundary surfaces, where it is not covered by the inner frame part 7 or the outer frame part 8. The coating 19 in this case has a thickness which is at least many times less than the wall thickness of the outer frame part, the inner frame part and/or the thermoelectric material 6 itself. One possible material for this coating 19, for example, is a coating 19 containing nickel or molybdenum, in particular one composed almost entirely of these materials. The coating 19 in this case serves as a diffusion barrier for the thermoelectric material 6.

Figure 4:
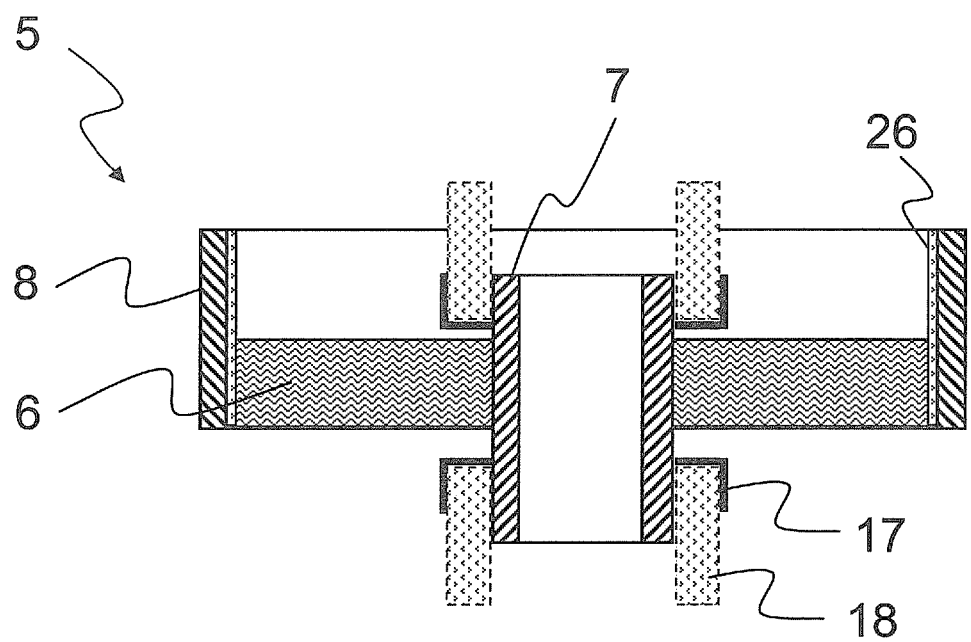
FIG. 4 is a longitudinal-sectional view of a further structural variant of a semiconductor element.

FIG. 4 shows a further structural variant of the semiconductor element, in which the inner frame part 7 in this case is used to form receptacles 17 for a sealing material 18. The receptacles 17 may likewise be formed in the manner of circumferential collars, as a groove or a similarly suitable formed element. It is furthermore possible for the receptacles 17 to be formed integrally or in one piece with the inner frame part 7. The sealing material 18 indicated therein serves, in particular, to seal off a gap between adjacent inner frame parts 7. An insulation layer 26 is also illustrated therein.

Figure 5:
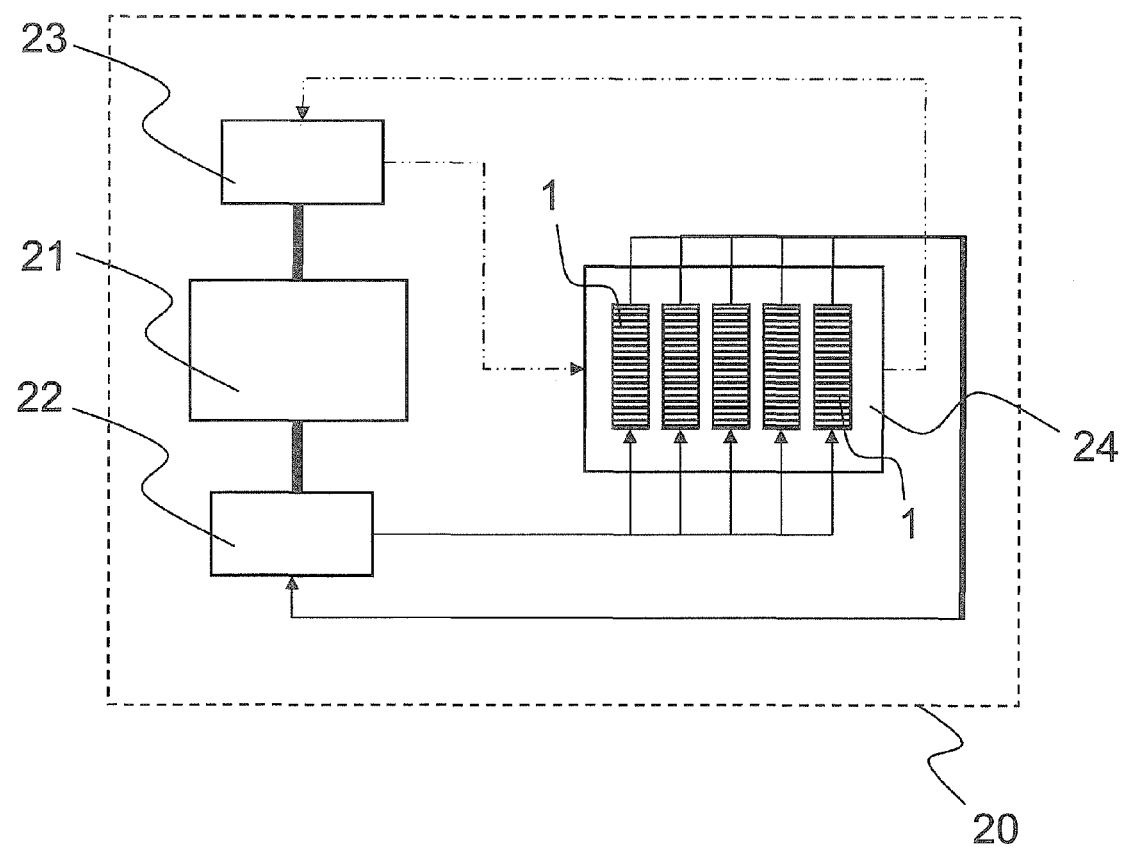
FIG. 5 is a block diagram of a vehicle having a thermoelectric generator.

Finally, FIG. 5 also diagrammatically illustrates the construction of a vehicle 20, which has an internal combustion engine 21, an exhaust system 22 and a cooling system 23. The vehicle 20 moreover includes a thermoelectric generator 24, which includes a plurality of the thermoelectric modules 1 described herein according to the invention. The thermoelectric generator 24 is constructed together with the exhaust system 22 and the cooling system 23 in such a way that a cold side is formed on the outer circumferential surface 4 of the modules 1 and a hot side is formed on the inner circumferential surface 2 of the thermoelectric module 1. For this purpose at least a fraction of the exhaust gas is led through the individual thermoelectric modules 1 before being fed back to the exhaust system 22 (or the internal combustion engine 21). In order to form the required temperature profile with respect to the thermoelectric modules 1, coolant is moreover fed to the thermoelectric generator 24 by the cooling system 23, so that the coolant flows around the outside of the thermoelectric modules 1 and is finally delivered to the cooling system 23 (or the internal combustion engine 21). It is clearly possible for the cooling system 23 and/or the exhaust system 22 to be constructed with secondary circuits for exhaust gas and/or coolant. In the same way it is possible, for example, to provide additional heat exchangers, valves, catalytic converters, etc. in the exhaust system. It is also evident that the thermoelectric generator 24 is also electrically connected to the vehicle 20, for example through suitable current consumers, current storage devices, controls, etc.

The invention thereby at least partially solves the problems outlined with regard to the state of the art. In particular, a thermoelectric module has been specified, which is technically easy to manufacture, which has a smaller number of parts, which is stable for the desired purpose and which moreover has a high level of efficiency in order to generate electrical energy from the thermal energy of an exhaust gas.

The invention claimed is:

1. A thermoelectric module, comprising:
   an inner circumferential surface having an axis;
   an outer circumferential surface;
   a plurality of semiconductor elements with thermoelectric material disposed in a direction of said axis between said inner circumferential surface and said outer circumferential surface and said semiconductor elements including at least one p-doped semiconductor element and at least one n-doped semiconductor element electrically interconnected in alternation;
   at least inner frame parts forming an interrupted inner circumferential surface or outer frame parts forming an interrupted outer circumferential surface;
   at least one part of said plurality of semiconductor elements having at least one of said inner frame parts or at least one of said outer frame parts; and
   an inherently unstable casing provided on said interrupted inner circumferential surface or said interrupted outer circumferential surface, said inherently unstable casing forming a circumferential surface directly adjacent heating medium passing the inner circumferential surface of the thermoelectric module or cooling medium passing the outer circumferential surface and protecting said plurality of semiconductor elements from the cooling or heating medium.

2. The thermoelectric module according to claim 1, wherein:
   said thermoelectric material of said semiconductor elements is disposed between said inner frame part and said outer frame part; and
   said inner frame part and said outer frame part each project on one side beyond said thermoelectric material to form a connecting area with an adjacent frame part.

3. The thermoelectric module according to claim 1, wherein at least said inner frame part or said outer frame part includes an insulation layer.

4. The thermoelectric module according to claim 1, wherein the thermoelectric module has said interrupted outer circumferential surface, said thermoelectric material of adjacent semiconductor elements are separated by a spacing corresponding to a free space formed between adjacent outer frame parts in said interrupted outer circumferential surface.

5. The thermoelectric module according to claim 1, wherein the thermoelectric module has said interrupted outer circumferential surface and adjacent outer frame parts form a free space filled with a porous insulation material, at least in said interrupted outer circumferential surface.

6. The thermoelectric module according to claim 1, which further comprises an adhesive disposed between said inherently unstable casing and at least one of said outer circumferential surface or said inner circumferential surface.

7. The thermoelectric module according to claim 1, wherein the thermoelectric module has said interrupted inner circumferential surface and adjacent inner frame parts in said interrupted inner circumferential surface form a gap bridged by a seal.

8. The thermoelectric module according to claim 1, wherein the thermoelectric module has said interrupted inner circumferential surface, said semiconductor elements form receptacles for a sealing material in vicinity of said interrupted inner circumferential surface.

9. The thermoelectric module according to claim 1, wherein said thermoelectric material of said semiconductor elements is provided at least partially with a coating.

10. A vehicle, comprising:
 an internal combustion engine;
 an exhaust system associated with said internal combustion engine;
 a cooling system associated with said internal combustion engine;
 a thermoelectric generator including a plurality of the thermoelectric modules according to claim 1;
 said exhaust system extending through said inner circumferential surface of said thermoelectric module; and
 said cooling system extending externally along said outer circumferential surface of said thermoelectric module.

* * * * *